(12) United States Patent
Yoneda et al.

(10) Patent No.: US 9,324,925 B2
(45) Date of Patent: Apr. 26, 2016

(54) LIGHT EMITTING DEVICE HAVING A METAL FILM EXTENDING FROM THE FIRST ELECTRODE

(71) Applicant: Nichia Corporation, Anan-shi, Tokushima (JP)

(72) Inventors: Akinori Yoneda, Anan (JP); Shinji Nakamura, Tokushima (JP); Yoshiyuki Aihara, Tokushima (JP); Hirokazu Sasa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/808,706

(22) Filed: Jul. 24, 2015

(65) Prior Publication Data
US 2015/0333236 A1 Nov. 19, 2015

Related U.S. Application Data

(62) Division of application No. 13/953,288, filed on Jul. 29, 2013, now Pat. No. 9,136,447.

(30) Foreign Application Priority Data

Jul. 30, 2012 (JP) .............................. P 2012-168300

(51) Int. Cl.
*H01L 27/15* (2006.01)
*H01L 31/12* (2006.01)
(Continued)

(52) U.S. Cl.
CPC .............. *H01L 33/507* (2013.01); *H01L 24/18* (2013.01); *H01L 33/38* (2013.01); *H01L 33/54* (2013.01);
(Continued)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

| | | | |
|---|---|---|---|
| 2001/0010449 A1 | 8/2001 | Chiu et al. | |
| 2007/0194712 A1 | 8/2007 | Shiraishi et al. | |

(Continued)

FOREIGN PATENT DOCUMENTS

| | | | |
|---|---|---|---|
| JP | H11-150298 A | 6/1999 | |
| JP | 2001-217467 A | 8/2001 | |

(Continued)

OTHER PUBLICATIONS

US Notice of Allowance issued in U.S. Appl. No. 13/953,288 mailed Apr. 27, 2015.

(Continued)

*Primary Examiner* — Hoai V Pham
(74) *Attorney, Agent, or Firm* — Foley & Lardner LLP

(57) ABSTRACT

To provide a method of manufacturing at low cost a light emitting device that converts the wavelength of light radiated by a light emitting element and emits, the method includes: forming a phosphor layer on a translucent substrate; arranging a plurality of light emitting elements with a predetermined spacing, the light emitting elements having an electrode formed face provided with positive and negative electrodes respectively and arranged with the electrode formed faces on the top; embedding a resin containing phosphor particles so that an upper face of the embedded resin does not bulge over a plane containing the electrode formed faces; and curing the resin, and then cutting and dividing the cured resin, the phosphor layer and the translucent substrate into a plurality of light emitting devices each including one or more of the light emitting elements.

6 Claims, 6 Drawing Sheets

(51) Int. Cl.
*H01L 33/00* (2010.01)
*H01L 33/50* (2010.01)
*H01L 33/58* (2010.01)
*H01L 33/60* (2010.01)
*H01L 33/38* (2010.01)
*H01L 33/54* (2010.01)
*H01L 23/00* (2006.01)
*H01L 33/46* (2010.01)

(52) U.S. Cl.
CPC ............ *H01L 33/58* (2013.01); *H01L 33/60* (2013.01); *H01L 33/46* (2013.01); *H01L 33/505* (2013.01); *H01L 2924/12041* (2013.01); *H01L 2924/15788* (2013.01); *H01L 2933/005* (2013.01)

(56) References Cited

U.S. PATENT DOCUMENTS

| | | | |
|---|---|---|---|
| 2009/0072256 A1 | 3/2009 | Park et al. | |
| 2009/0173957 A1 | 7/2009 | Brunner et al. | |
| 2011/0220953 A1 | 9/2011 | Bechtel et al. | |
| 2012/0142124 A1 | 6/2012 | Yoo et al. | |
| 2012/0142127 A1 | 6/2012 | Park et al. | |
| 2013/0069525 A1 | 3/2013 | Imai | |
| 2013/0105850 A1 | 5/2013 | Komatsu et al. | |
| 2013/0313587 A1* | 11/2013 | Lin .................. | H01L 33/62 257/95 |
| 2014/0001949 A1 | 1/2014 | Kimura et al. | |
| 2015/0034990 A1 | 2/2015 | Roitman et al. | |
| 2015/0162503 A1 | 6/2015 | Bechtel et al. | |

FOREIGN PATENT DOCUMENTS

| | | |
|---|---|---|
| JP | 2001-308380 A | 11/2001 |
| JP | 2002-141559 A | 5/2002 |
| JP | 2003-273408 A | 9/2003 |
| JP | 2005-294288 A | 10/2005 |
| JP | 2007-208041 A | 8/2007 |
| JP | 2011-009572 A | 1/2011 |
| JP | 2011-244017 A | 12/2011 |
| JP | 2012-510716 A | 5/2012 |
| JP | 2012-119673 A | 6/2012 |
| JP | 2012-138454 A | 7/2012 |
| JP | 2012-227470 A | 11/2012 |
| JP | 2013-012544 A | 1/2013 |
| WO | WO-2010/123059 A1 | 10/2010 |
| WO | WO-2012/014439 A1 | 2/2012 |

OTHER PUBLICATIONS

US Office Action issued in U.S. Appl. No. 13/953,288 mailed Sep. 18, 2014.

Office Action for Japanese Patent Application No. 2012-168300 dated Jan. 19, 2016.

* cited by examiner

LIGHT EMITTING DEVICE HAVING A METAL FILM EXTENDING FROM THE FIRST ELECTRODE

CROSS-REFERENCE TO RELATED APPLICATIONS

The present application is a division of U.S. patent application Ser. No. 13/953,288, filed Jul. 29, 2013, and claims priority under 35 U.S.C. §119 to Japanese Patent Application No. 2012-168300, filed Jul. 30, 2012. The contents of these applications are incorporated herein by reference in their entirety.

BACKGROUND

1. Field of the Invention

The present invention relates to a light emitting device, and to a method of manufacturing the same.

2. Description of Related Art

With regard to light emitting devices that convert the wavelength of light radiated by a light emitting element and emit it outside, JP 2002-141559A discloses a configuration in which a light emitting diode chip and a phosphor chip are fixedly bonded to each other by a transparent adhesive. The phosphor chips of JP 2002-141559A include, for example, a substrate and a phosphor mixed in the substrate. Some disclosed examples are: a phosphor chip that is cut out of a phosphor ingot made of monocrystal, polycrystal or sintered phosphor powder; a phosphor chip that is formed by mixing a phosphor powder with a binder such as a resin and a metalloxane sol, injecting it into a mold, and drying and curing it by heat; and a phosphor chip that is formed by mixing a phosphor powder with a binder, molding it to a plate, drying and curing it by heat, and then cutting it out.

Phosphor chips have, for example, a recess to house a light emitting element, and a light emitting diode chip is fitted therein and fixed by an adhesive. An optically transparent resin such as an epoxy resin, an acrylic resin, a polycarbonate resin and a polyimide resin may be used for the adhesive.

The conventional light emitting devices as disclosed in JP 2002-141559A are, however, manufactured by fitting a light emitting diode chip into a separately produced phosphor chip. This requires a lot of work because the devices have to be assembled individually. As a result, it has been impossible to achieve a low production cost.

Further, such light emitting devices suffer from poor thermal dissipation if the light emitting face and side faces of their light emitting element are covered with a phosphor layer for example.

SUMMARY

According to one aspect of the present invention, a method of manufacturing the light emitting device comprising: a phosphor layer forming step of forming a phosphor layer on a translucent substrate; a light emitting element arranging step of arranging a plurality of light emitting elements with a predetermined spacing, the light emitting elements having an electrode formed face provided with positive and negative electrodes respectively and arranged with the electrode formed faces on the top; a resin embedding step of embedding a resin containing phosphor particles so that an upper face of the embedded resin does not bulge over a plane containing the electrode formed faces; and a dividing step of curing the resin, and then cutting and dividing the cured resin, the phosphor layer and the translucent substrate into a plurality of light emitting devices each including one or more of the light emitting elements.

According to another aspect of the present invention, a method of manufacturing a light emitting device comprising: a light emitting element arranging step of arranging a plurality of light emitting elements on a phosphor-containing substrate with a predetermined spacing; a resin embedding step of embedding a resin between the arranged light emitting elements; and a dividing step of curing the resin, and then cutting and dividing the cured resin and the phosphor-containing substrate into a plurality of light emitting devices each including one or more of the light emitting elements.

According to further aspect of the present invention, a light emitting device comprising: a light emitting element that comprises (a) a first semiconductor layer on a substrate and a second semiconductor layer on the first semiconductor layer, wherein a first electrode and a second electrode are respectively provided on same sides of the first semiconductor layer and the second semiconductor layer, the first electrode being surrounded by the second semiconductor layer; and (b) a metal film extending from the first electrode over the second semiconductor layer so as to be insulated by an insulation film; a phosphor layer covering the substrate of the light emitting element; and a resin layer covering side faces of the light emitting element, wherein the resin layer is provided on the side faces of the light emitting element.

BRIEF DESCRIPTION OF THE DRAWINGS

The disclosure will become more fully understood from the following detailed description, taken in conjunction with the accompanying figures, in which.

DETAILED DESCRIPTION

Figure 1A:
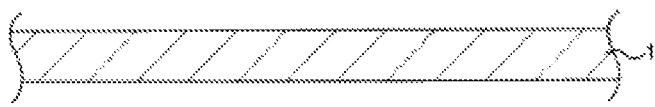
FIGS. 1A through 1E are cross sectional views illustrating the workflow of a manufacturing method according to a first embodiment, FIG. 1A showing a translucent substrate, FIG. 1B showing a phosphor layer on the translucent substrate, FIG. 1C showing light emitting elements on the phosphor layer, FIG. 1D showing resin between the light emitting elements, and FIG. 1E showing a sheet attached to the translucent substrate for cutting.

It is an object of embodiments of the present invention to provide a method of manufacturing at low cost a light emitting device that converts the wavelength of light radiated by a light emitting element and emits it outside.

Another object of embodiments of the present invention is to provide a light emitting device in which the light emitting face and side faces of its light emitting element are covered with a phosphor layer while it has high thermal dissipation characteristics.

In order to accomplish at least one of the above objects, a first method of manufacturing the light emitting device according to one embodiment includes: a phosphor layer forming step of forming a phosphor layer on a translucent substrate; a light emitting element arranging step of arranging a plurality of light emitting elements with a predetermined spacing, the light emitting elements having an electrode formed face provided with positive and negative electrodes respectively and arranged with the electrode formed faces on the top; a resin embedding step of embedding a resin containing phosphor particles so that an upper face of the embedded resin does not bulge over a plane containing the electrode formed faces; and a dividing step of curing the resin, and then cutting and dividing the cured resin, the phosphor layer and the translucent substrate into a plurality of light emitting devices each including one or more of the light emitting elements.

With this method, light emitting devices having a light emitting element that is surrounded by a phosphor layer and resin can be manufactured efficiently. Further, since the light emitting devices include a phosphor layer, it is not required to mount a light emitting element on a package with a recess and to seal it by a phosphor containing resin as it was in the past, which reduces the size of the light emitting devices.

A second method of manufacturing a light emitting device according to another aspect of the present embodiment includes: a light emitting element arranging step of arranging a plurality of light emitting elements on a phosphor-containing substrate with a predetermined spacing; a resin embedding step of embedding a resin between the arranged light emitting elements; and a dividing step of curing the resin, and then cutting and dividing the cured resin and the phosphor-containing substrate into a plurality of light emitting devices each including one or more of the light emitting elements.

With this method, since the light emitting elements are arranged on the phosphor-containing substrate, unevenness in color between the divided light emitting devices can be reduced. Further, by adjusting the thickness of the phosphor containing substrate, light emitting devices having a desired color and uniform emission wavelength can be manufactured efficiently.

In the second method of manufacturing the light emitting device of the present embodiment, the resin may contain phosphor particles.

With this configuration, the light extraction face of the light emitting element is covered with the member containing phosphor particles, which makes it possible to manufacture light emitting devices that can convert the light from the light emitting element with high efficiency.

In the second method of the manufacturing the light emitting device of the present embodiment, the resin may contain a light reflective material.

With this configuration, the side faces of the light emitting element are covered with the resin containing a light reflective material, and accordingly, the light from the light emitting element is mainly released toward the upper face of the light emitting device. As a result, it becomes possible to manufacture the light emitting devices having an approximately point source of light.

In the first and second methods of manufacturing the light emitting device of the present embodiment, wherein each of the light emitting elements may include (a) a first semiconductor layer on a substrate and a second semiconductor layer on the first semiconductor layer, wherein a first electrode and a second electrode are respectively provided on same sides of the first semiconductor layer and the second semiconductor layer; and (b) a metal film extending from the first electrode over the second semiconductor layer so as to be insulated by an insulation film.

With this configuration, a light emitting device having good heat dissipation characteristics can be manufactured.

A light emitting device according to another aspect of the present embodiment includes: a light emitting element that comprises (a) a first semiconductor layer on a substrate and a second semiconductor layer on the first semiconductor layer, wherein a first electrode and a second electrode are respectively provided on same sides of the first semiconductor layer and the second semiconductor layer, the first electrode being surrounded by the second semiconductor layer; and (b) a metal film extending from the first electrode over the second semiconductor layer so as to be insulated by an insulation film; a phosphor layer covering the substrate of the light emitting element; and a resin layer covering side faces of the light emitting element, wherein the resin layer is provided on the side faces of the light emitting element.

Further, a light emitting device according to another aspect of the present embodiment includes: a light emitting element that comprises (a) a first semiconductor layer on a substrate and a second semiconductor layer on the first semiconductor layer, wherein a first electrode and a second electrode are respectively provided on same sides of the first semiconductor layer and the second semiconductor layer; and (b) a metal film extending from the first electrode over the second semiconductor layer so as to be insulated by an insulation film; a phosphor-containing substrate covering the substrate of the light emitting element; and a resin layer covering side faces of the light emitting element, wherein the resin layer is provided on the side faces of the light emitting element.

The structure where the substrate of the light emitting element is covered with the phosphor layer or phosphor-containing substrate, and the side faces of the light emitting element are covered with the resin layer requires good heat dissipation characteristics.

With the configuration of the present embodiment, since the first electrode is extended over the second semiconductor layer, the first electrode can be laid in a broad area, which offers an increased contact area between the electrodes of the light emitting device and a member on which the device is mounted. As a result, the heat dissipation characteristics are improved. Further, the light emitting element is in direct contact with the resin layer, i.e. there is no light-absorbing member between the light emitting element and resin layer, which improves the light extraction efficiency.

In a certain embodiment of the light emitting device, the device further includes: a translucent substrate facing the substrate of the light emitting element across the phosphor layer; and an anti-reflection film both or either between the phosphor layer and the translucent substrate and/or on the other face of the translucent substrate from the phosphor layer.

With this configuration, decrease in light extraction efficiency can be prevented.

In a certain embodiment of the light emitting device, the first electrode is surrounded by the second semiconductor layer.

Electric current concentrates at the gap between the first semiconductor layer and second semiconductor layer. If the first electrode is placed at an end of the light emitting element, electric current tends to concentrate at the end of the light emitting element.

With the configuration of the present embodiment, electric current can be dispersed around the first electrode, which results in uniform electric current density.

In a certain embodiment of the light emitting device, the resin layer contains phosphor particles.

With this configuration, the light extraction face of the light emitting element is covered with the member containing phosphor particles. Thus, the light emitting device can convert the light from the light emitting element with high efficiency.

In a certain embodiment of the light emitting device, the resin layer contains a light reflective material.

With this configuration, the side faces of the light emitting element are covered with the resin containing a light reflective material. Thus, the light from the light emitting device is mainly released toward the upper face of the light emitting device, which imparts a near point source of light to the light emitting device.

By the above-mentioned manufacturing methods of the present embodiment, the phosphor layer on the light emitting face and the resin covering the side faces can be formed on the plurality of (a large number of) light emitting elements at a time, which makes it possible to manufacture the light emitting devices efficiently at low cost, in which the light emitting face and side faces except for the electrode formed face are covered with the phosphor layer or a resin.

Further, with the above-mentioned manufacturing methods of the present embodiment, since the first electrode is provided with the metal film extending from the first electrode over the second semiconductor layer sandwiching the insulation film, the heat dissipation characteristics can be improved despite the presence of the phosphor layer covering the substrate of the light emitting element and the resin layer covering the side faces of the light emitting element.

Embodiments of the invention will now be described with reference to the accompanying drawings, wherein like reference numerals designate corresponding or identical elements throughout the various drawings.

However, the below mentioned embodiments are intended to illustrate exemplary light emitting devices for implementing the technical concept of the present invention, and are not intended to limit elements recited in the scope of claims to those described in the embodiments. A size, a material, and a shape of the constituent members, and a relative positioning therebetween exemplified in the embodiments are not intended to limit the scope of the present invention. The size and the positional relationship of the members illustrated in each drawing may be enlarged for the sake of clear explanation. Further, in the following description, the same titles and the same reference numbers and/or symbols indicate the same or the equivalent members and thus detailed descriptions of them are omitted.

First Embodiment

In a manufacturing method according to the first embodiment, a light emitting device is manufactured through the following procedure.

(Phosphor Layer Forming Step)

Figure 1B:
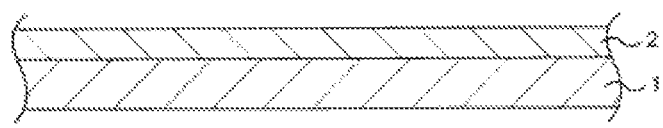

First, as illustrated in FIGS. 1A and 1B, a phosphor layer 2 is formed on a translucent substrate 1.

The translucent substrate 1 may be a glass substrate made of quartz or borosilicate glass for example. The preferred thickness is 30 µm to 1 mm. Although a thinner substrate exhibits less light absorption, if the translucent substrate 1 is too thin, it may break during the production. If it is too thick, it becomes difficult to cut it in the dividing step described below. For this reason, 50 to 500 µm is more preferred.

The phosphor layer 2 may be made of a mixture of a binder resin and a phosphor described below. Preferred binder resins include, for example, silicone resins, modified silicone resins and the like. Translucent insulating resins such as epoxy resins, modified epoxy resins and acrylic resins may also be used. Furthermore, resins having excellent weatherability, such as hybrid resins containing at least one of these resins, may also be used.

The phosphor layer 2 may be formed by a method known in the art, including printing, compression molding, spin coating, dispensing and the like for example.

It is preferred that the phosphor layer 2 has a uniform thickness without uneven distribution of the phosphor particles. Of the phosphor layer forming methods listed above, printing and compression molding are particularly preferred in this regard.

(Light Emitting Element Arranging Step)

Figure 1C:
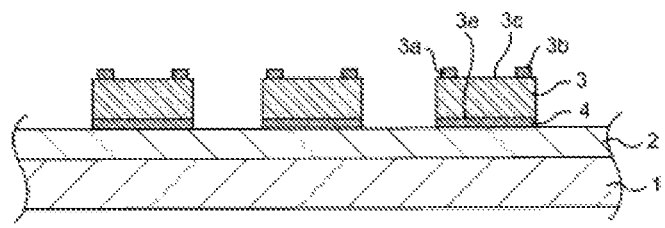
Figure 1D:
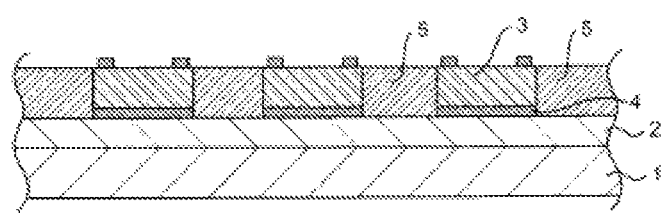
Figure 1E:
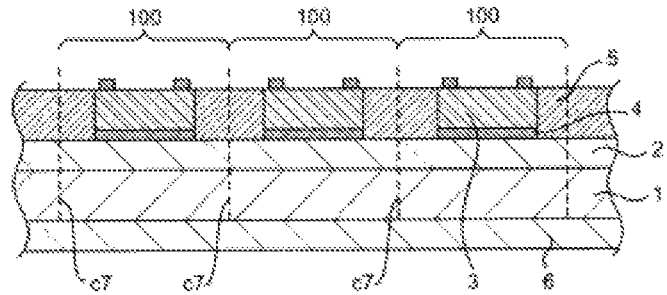
Figure 1F:
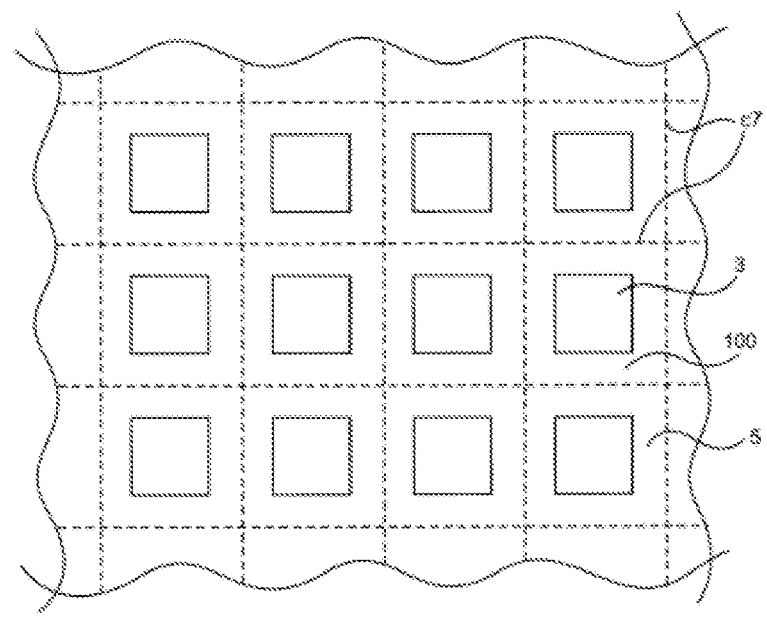
FIG. 1F is a plan view illustrating an arrangement of light emitting elements in the manufacturing method according to the first embodiment.
Figure 2A:
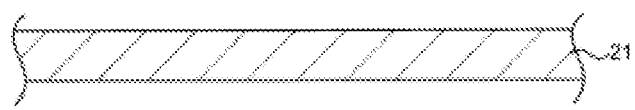
FIGS. 2A through 2D are cross sectional views illustrating the workflow of a manufacturing method according to a second embodiment, FIG. 2A showing a phosphor-containing substrate, FIG. 2B showing light emitting elements on the phosphor-containing substrate, FIG. 2C showing resin between the light emitting elements, and FIG. 2D showing a sheet attached to the translucent substrate for cutting.
Figure 2B:
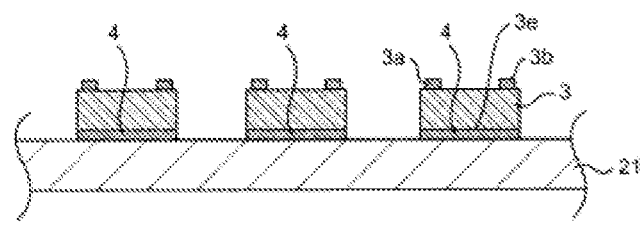
Figure 2C:
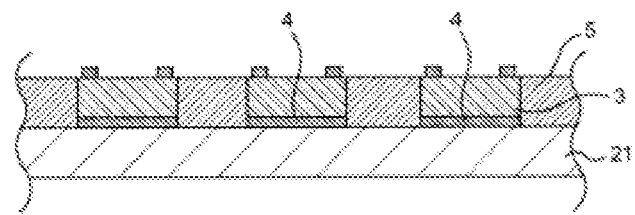
Figure 2D:
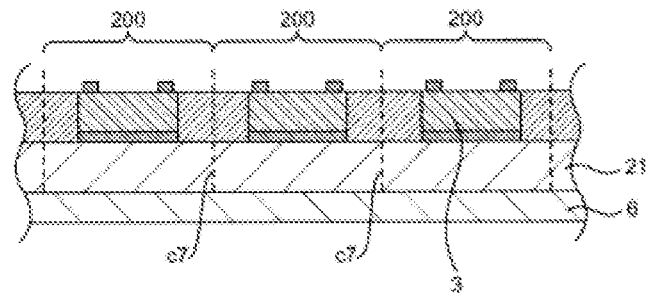

Next, as illustrated in FIGS. 1C and 1F, a plurality of light emitting elements 3 are arranged on the phosphor layer 2 with predetermined spacings. The spacings between the light emitting elements 3 may be any length 10 µm or more, but 50 to 100 µm is preferred for mass production.

Specifically, adhesives 4 are applied to predetermined areas, and light emitting elements 3 are placed on each adhesive 4. Each of the light emitting elements 3 include positive and negative electrodes 3a and 3b on the other face from a light emitting face 3e (i.e. on an electrode-formed face 3c), and is placed such that the light emitting face 3e faces the phosphor layer 2.

The spacings between the light emitting elements 3 are determined such that they corresponds to the outer dimensions of light emitting devices 100, which are manufactured by cutting the phosphor layer 2 and translucent substrate 1 along the midway between the light emitting elements 3.

FIG. 1F illustrates an example where the light emitting elements 3 have a square upper face in a plan view. The present embodiment is however not limited thereto, and may employ light emitting elements having a rectangular or polygonal upper face in a plan view.

The electrodes of the light emitting elements 3 are not shown in the plan view of FIG. 1F.

(Resin Embedding Step)

Next, as illustrated in FIG. 1D, a resin 5 is embedded between the arranged light emitting elements 3, and the embedded resin (embedded resin 5) is cured. The embedded resin 5 is embedded such that at least a part of the upper face of each light emitting element 3 is exposed, i.e. the upper face of the embedded resin 5 does not bulge over the plane containing the electrode formed faces 3c of the light emitting elements 3. It is preferred that the upper face corresponds to the plane containing the electrode formed faces 3c. This configuration can prevent the light emitting elements from being mounted with a tilt, even if the resin 5 is comparatively thick on the side faces of the light emitting elements 3 (in the direction perpendicular to the side faces of the light emitting elements). The amount of the resin to be embedded and the area of the light emitting elements covered by the resin may be suitably set such that the surfaces of the positive and negative electrodes 3a and 3b are at least partially exposed, i.e. the positive and negative electrodes 3a and 3b can be connected to an external power supply. In this regard, mounting becomes easier if the positive and negative electrodes 3a and 3b are entirely exposed from the resin 5.

The embedded resin 5 may be made of any of the materials listed above for the binder resin of the phosphor layer 2.

(Dividing Step)

Lastly, as illustrated in FIG. 1E, after the resin 5 is cured, the cured resin 5, phosphor layer 2 and translucent substrate 1 are cut along cutting lines c7 by dicing, breaking or the like, to divide them into individual light emitting devices 100. The cutting lines c7 are set such that they correspond with the center lines between adjacent light emitting elements 3. The distance between the cutting lines c7 and the light emitting elements 3 may be adjusted arbitrarily, but 100 µm or less is preferred for mass production. Further, 25 to 50 µm is preferred for reducing the size of the light emitting devices 100.

In this regard, as illustrated in FIG. 1E, it is preferred that a sheet 6 is attached onto the back face of the translucent substrate 1 and the sheet 6 is left uncut in the dividing step so that the divided light emitting elements 100 are held arranged on the sheet 6.

The manufacturing method of the first embodiment as described above produces a light emitting device wherein the light emitting face and side faces except the electrode formed face 3c are covered with the phosphor layer 2 or resin 5, and wherein the light emitting device coverts light radiated from the light emitting element and emits it outside.

With the manufacturing method of the first embodiment, the phosphor layer 2 on the light emitting face and the resin 5 covering the side faces can be formed on a plurality of (a large number of) light emitting elements 3 at a time, which enables efficient and low-cost manufacture of the light emitting devices in which the light emitting face and side faces except the electrode formed face 3c are covered with the phosphor layer 2 or resin 5.

In the manufacturing method according to the first embodiment, it is preferred that an anti-reflection film is formed either or both between the phosphor layer 2 and the translucent substrate 1 and/or on the other face of the translucent substrate 1 from the phosphor layer 2, which can improve the light extraction efficiency.

Second Embodiment

A manufacturing method according to the second embodiment differs from the manufacturing method of the first embodiment in that it employs a phosphor-containing substrate 21 that contains a phosphor. That is, as can be seen in the work flow in FIGS. 2A through 2D, the manufacturing method of the second embodiment is the same as the manufacturing method of the first embodiment except that it does not include the step of forming the phosphor layer 2 on the translucent substrate 1.

The phosphor-containing substrate 21 is made of a composite material that includes an inorganic material base and a phosphor dispersed in the inorganic material. Examples of inorganic materials which can form the base include inorganic crystals such as sapphire, amorphous materials such as glass, various inorganic materials such as ceramics and the like.

A light emitting device using the phosphor-containing substrate 21 has the following characteristics.

In general, there is little difference between in refractive index between inorganic materials such as glass and sapphire and phosphors, which are also composed of inorganic material. For example, aluminum-containing phosphors having a garnet structure have a refractive index of approximately 1.7 to 1.8. Compared to this, while general translucent resins have a refractive index of approximately 1.5, glass and sapphire have refractive indexes of approximately 1.6 and 1.7 respectively. This means less light dispersion by the phosphor in the phosphor-containing substrate 21, which can prevent the light from returning to the light emitting element 3.

Further, inorganic materials have higher hardness compared to organic materials such as resins, and are applicable to high-temperature processing, which makes it possible to form wiring on the phosphor-containing substrate 21 and offers applications that utilizes such characteristics.

Furthermore, a higher thermal conductivity can be rendered to the phosphor-containing substrate 21 compared to resins, which offers improved heat dissipation. In order to exert its heat dissipation characteristics more effectively, the phosphor-containing substrate 21 has a thermal conductivity of desirably 0.8 W/mK or more, more preferably 1.2 W/mK or more, further more preferably 3.5 W/mK or more. The phosphor-containing substrate 21 made of such materials can improve the heat dissipation characteristics, which can render high reliability to the light emitting device 200.

The phosphor which is used in the manufacturing methods of the first and second embodiments is selected from phosphors that are excited by the emission of the light emitting element 3. If the light emitting element 3 is a blue-light emitting element and a white-light emitting device is to be manufactured, it is preferred to use a phosphor that is excited by blue light to emit yellow broad light. Examples of such phosphors include, for example, cerium-activated phosphors having a garnet structure (in particular, cerium-activated aluminum-containing phosphors having a garnet structure). Since cerium-activated phosphors emit broad yellow light, a combination with blue light can produce white light with good color rendering properties. Further, since phosphors having a garnet structure, in particular aluminum-containing phosphors having a garnet structure, are resistant to heat, light and moisture, they can keep high-intensity yellow emission for a long period. For example, preferred phosphors are YAG phosphors (generally abbreviated as YAG) represented by $(Re_{1-x}Sm_x)_3(Al_{1-y}Ga_y)_5O_{12}$: Ce (where $0 \le x < 1$, $0 \le y \le 1$, Re is an element selected from a group consisting of Y, Gd, La, Lu and Tb). In addition to yellow phosphors, a phosphor such as $Lu_3Al_5O_{12}$: Ce, $BaMgAl_{10}O_{17}$: Eu, $BaMgAl_{10}O_{17}$:Eu—Mn, (Zn—Cd)Zn: Cu, $(Sr—Ca)_{10}(PO_4)_6Cl_2$: Eu—Mn, $(Sr—Ca)_2Si_5N_8$: Eu, $CaAlSiB_xN_{3+x}$: Eu and $CaAlSiN_3$: Eu may be used for adjusting the color rendering properties.

In some cases, particularly if the light emitting element 3 emits short-wavelength light, the phosphor layer 2 or the phosphor-containing substrate 21 may contain two or more types of phosphors. It may also be possible that the primary light from the light emitting element 3 excites one phosphor to cause light emission, and the secondary light emitted by the phosphor excites another phosphor to cause light emission. Further, using two types of phosphors having different chromaticities and adjusting the amounts of these two phosphors makes it possible to obtain any light at a chromaticity point within the area in the chromaticity chart that is defined by connecting the chromaticity points of these two phosphors and the light emitting element.

The light emitting element 3 which is used in the first and second embodiments may be any element that includes a semiconductor light emitting layer. Specifically, light emitting elements that include a light emitting layer of a nitride semiconductor, particularly a light emitting layer of a gallium nitride compound semiconductor (in particular InGaN), can make a suitable combination with the phosphor because they can emit strong light in short-wavelength or near-ultraviolet part of the visible light range. It is desirable that the light emitted from the light emitting layer 38 of the light emitting element 3 has an emission spectrum whose peak is located within near-ultraviolet to short visible light range, i.e. 240 nm to 500 nm, preferably 380 nm to 420 nm, more preferably 450 nm to 470 nm. Light emitting elements that emit light within these ranges can produce desired light, in particular white light, by combining them with various phosphors. The light emitting element 3 may also include a semiconductor light emitting layer of Ze, ZnSe, InGaAs, AlInGaP or the like instead.

In the above manufacturing methods of the first and second embodiments, the resin 5 may contain phosphor particles. For example, if it contains the same phosphor particles as in the phosphor layer 2, it becomes possible to utilize light emitted from the side faces of the light emitting element 3 by converting its wavelength.

Further, in the above manufacturing methods of the first and second embodiments, the resin 5 may contain a light-reflective material. With this configuration, the light emitted from the side faces of the light emitting element 3 can be reflected toward the phosphor layer 2 by the light-reflective material contained in the resin 5, and then the reflected light can be converted in wavelength and emitted outside. The emission efficiency can be thus improved. The light-reflective material may be one oxide selected from a group consisting of Ti, Zr, Nb, Al, Si and Mg, or at least one of AlN and MgF. Specifically, it may be at least one selected from a group consisting of $TiO_2$, $ZrO_2$, $Nb_2O_5$, $Al_2O_3$, MgF, AlN, $SiO_2$ and MgO.

By changing the thicknesses and the phosphor amounts according to the emission wavelength range of the light emitting element 3, the phosphor layer 2 and phosphor-containing substrate 21 can be used to adjust unevenness in color between the light emitting devices, or to obtain the light emitting devices of any desired color. The thickness may be 10 to 100 µm. Considering light absorption by the phosphor layer 2 and phosphor-containing substrate 21, smaller thickness is preferred. Further, since the light emitting elements 3 are arranged on the phosphor layer 2 or phosphor-containing substrate 21 at regular intervals, and then they are divided into individual light emitting devices 100 or 200, a plurality of light emitting devices having a uniform color can be efficiently manufactured. If the light emitting elements 3 to be placed on the phosphor layer 2 or phosphor-containing substrate 21 are screened to have similar emission properties, it is possible to manufacture a plurality of light emitting devices that have a more uniform color.

It is also possible to determine the spacings between the light emitting elements 3 arranged on the phosphor layer 2 or phosphor-containing substrate 21 according to the emission wavelength range or emission properties of the light emitting elements 3. That is, wider spacings between adjacent light emitting elements 3 can increase the amount of embedded resin 5 on the side faces of the light emitting elements 3, and narrower spacings can decrease the amount of the embedded resin 5, with which the color of the light emitting devices 100 or 200 can be controlled.

Third Embodiment

A light emitting device according to the third embodiment is the light emitting device manufactured by the method of the first or second embodiment, wherein a light emitting element 3 is configured as follows to prevent deterioration of the heat dissipation characteristics that is caused by a phosphor layer covering the light emitting face and side faces of the light emitting element.

Hereinafter, a nitride semiconductor light emitting element used in the third embodiment will be described in detail with reference to the drawings.

Figure 3:
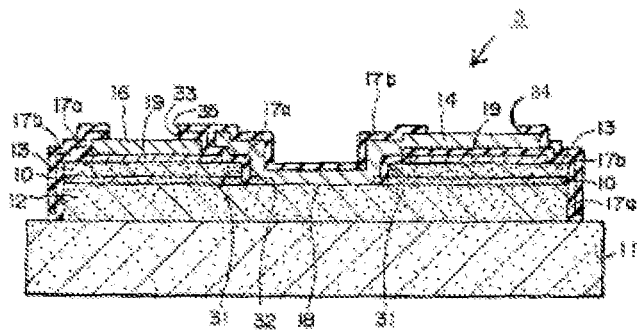
FIG. 3 is a cross sectional view illustrating the configuration of a nitride semiconductor light emitting element used in a light emitting device according to a third embodiment.

The nitride semiconductor light emitting element as illustrated in FIG. 3 includes a substrate 11, which is made of sapphire for example, and a semiconductor layered structure formed thereon in which an n-type nitride semiconductor layer 12, which is made of Si-doped AlInGaN for example, a light emitting layer 10, which is made of InGaN for example, and a p-type nitride semiconductor layer 13, which is made of Mg-doped AlInGaN for example, are laminated in this order. The nitride semiconductor light emitting element has the following configuration.

1) In the nitride semiconductor light emitting element of the first embodiment, the center part of the p-type nitride semiconductor layer is removed in a circular shape, forming an opening 31. With this configuration, the surface of the n-type nitride semiconductor layer 12 is exposed through the opening 31.

Figure 4:
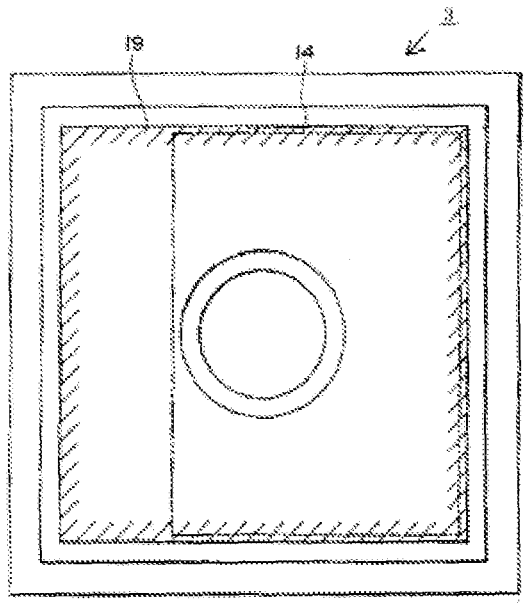
FIG. 4 is a plan view of the nitride semiconductor light emitting element of the third embodiment.

2) As illustrated in FIG. 4, a positive electrode 19 is formed on the p-type nitride semiconductor layer 13, covering a large area except for the vicinities of the opening 31 and the periphery. The positive electrode 19 may be made of, for example, a single layer or laminated layers of a metal or alloy that includes at least one selected from a group of consisting of Ni, Pt, Pd, Rh, Ru, Os, Ir, Ti, Zr, Hf, V, Nb, Ta, Co, Fe, Mn, Mo, Cr, W, La, Cu, Ag, Y, Al, Si, Au, the oxides and nitrides thereof, and translucent conductive oxides such as ITO, ZnO and $In_2O_3$. The film thickness is not specifically limited, and may be suitably adjusted according to the desired properties. It is desirable that the positive electrode 19 reflects the light from the light emitting layer 10 at high efficiency. In this respect, a single layer or laminated layers of at least one metal or alloy selected from Al, Rh and Ag is(are) preferred.

3) A p-terminal lead electrode 16 is formed in an approximately rectangular shape, and positioned between the opening 31 and one of the side edges on the positive electrode 19. The lead electrode 16 may also function as an electrode for mounting the light emitting device 100 or 200 on a mounting board, and may be made of any of the materials listed above for the positive electrode 19.

4) An insulation film 17a is formed covering the side faces of the positive electrode 19, p-type nitride semiconductor layer 13 and n-type semiconductor layer 12. The insulation film 17a may be extended to the substrate 11.

The insulation film 17a has an opening 32 that is concentrically formed inside the opening 31 and an opening 33 that is formed on the lead electrode 16. The insulation film 17a is made of, for example, an oxide film, nitride film, oxynitride film or the like containing at least one element selected from a group consisting of Si, Ti, V, Zr, Nb, Hf and Ta. Specifically, examples such films include $SiO_2$, $ZrO_2$, SiN, BN, SiC, SiOC, AlN and AlGaN. The insulation film may be a single- or multi-layer film of a single material or a multi-layer film of different materials. It may also be a DBR (distributed Bragg reflector) film.

5) A negative electrode 14 may be made of any of the materials and laminated structures listed above for the positive electrode 19 or the p-terminal lead electrode 16, and is formed in connection with the surface 18 of the n-type nitride semiconductor layer 12 that is exposed through the opening 32. As illustrated in FIG. 4, the side of the negative electrode 14 facing the p-terminal lead electrode 16 is extended to the vicinity of the lead electrode 16 such that it overlaps with the positive electrode 19 sandwiching the insulation film 17a in any part. The opposite side of the negative electrode 14 is formed substantially covering the positive electrode 19 sandwiching the insulation film 17a. With this configuration, the negative electrode 14 and the positive electrode 19 are insulated from each other, which enables the three-dimensional structure of the electrode. The negative electrode 14 may be extended from the surface 18 of the n-type nitride semiconductor layer 12 to the area over the nitride semiconductor layer 13, or alternatively, it may also be extended to cover the n-type nitride semiconductor layer, p-type nitride semiconductor layer and positive electrode 19 by firstly providing a material having good contact with the n-type nitride semiconductor layer 12 and then providing thereon a high-reflective material such as Al, Rh and Ag. With this configuration, since the electrode formed face of the light emitting element 3 is covered with the high-reflective material, the light extraction efficiency is improved.

6) An insulation film 17b has an opening 35 at the position corresponding to the opening 33 on the lead electrode 16 and an opening 34 at the opposite side from the opening 35 on the negative electrode 14, and is formed covering the electrodes and semiconductor layers. The insulation film 17b may be made of any of the materials and laminated structures listed above for the insulation film 17a.

The negative electrode 14 in the opening 34 can also function as an electrode for mounting the light emitting device 100 or 200 on a mounting board, but a mounting electrode may be further provided on the negative electrode 14.

In the nitride semiconductor light emitting element of the third embodiment with the above configuration, the upper faces of both n-type nitride semiconductor layer 12 and p-type nitride semiconductor layer 13 are covered with either positive electrode 19 or negative electrode 14, and the negative electrode 14 is extended to the vicinity of the lead electrode 16 such that it overlaps with the positive electrode 19 sandwiching the insulating film 17a.

As described above, since the negative electrode 14 is formed substantially covering the positive electrode 19 sandwiching the insulation film 17a, the heat dissipation characteristics can be improved, and the light generated in the light emitting layer 10 can be prevented from leaking from the upper part.

In the third embodiment, the surface 18 (exposed part) of the n-type nitride semiconductor layer 12 is a single circle positioned at the center part of the light emitting element 3, on which the negative electrode 14 is provided, but the present embodiment is not limited thereto. That is, a plurality of surfaces 18 may be scattered uniformly, and the negative electrode 14 may be formed thereon. In particular, it is preferred that the negative electrode 14, which is in contact with the surface 18 of the n-type nitride semiconductor layer 12, is surrounded by the p-type nitride semiconductor layer 13. Electric current concentrates near the p-type nitride semiconductor layer 13 in the surface 18 (exposed part) of the n-type nitride semiconductor layer 12. Accordingly, providing a plurality of negative electrodes 14 and surrounding them by the p-type nitride semiconductor layer 13 can contribute to equalization of the electric current density.

The shape of the surface 18 of the n-type nitride semiconductor layer 12 may be any shape, including a circle, ellipse, polygon, rounded polygon, straight line, curved line and the like. Since the surface 18 of the n-type semiconductor layer 12 reduces the area of the light emitting layer 10, it is preferred that the area of the surface 18 is as small as possible.

Therefore, the light emitting device according to the third embodiment offers good heat dissipation characteristics, in which the light emitting face and side faces of the light emitting element are covered with a phosphor layer.

In addition, the light emitting element 3 is not limited to the embodiments. In other words, instead of the electrodes having the three-dimensional structure, for example, the positive electrode 19 and the negative electrode 14 are respectively provided on the p-type nitride semiconductor layer 13 and the n-type nitride semiconductor layer 12.

In the light emitting device of the third embodiment, the resin layer, which is provided to cover the periphery of the nitride semiconductor light emitting element, may contain phosphor particles or a light-reflective material.

The light emitting device of the third embodiment may further include a translucent substrate facing the substrate 11 of the nitride semiconductor light emitting element across the phosphor layer. Furthermore, the light emitting device may include an anti-reflection film either or both between the phosphor layer and the translucent substrate and/or on the other face of the translucent substrate from the phosphor layer.

Modification

Figure 5A:
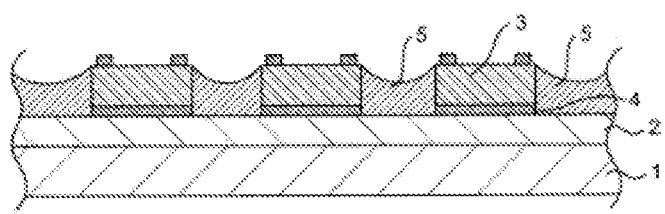
FIGS. 5A and 5B are cross sectional views illustrating a part of a modified manufacturing process, FIG. 5A showing a reduced amount of resin between the light emitting elements relative to the embodiment of FIG. 1D, and FIG. 5B showing a sheet attached to a translucent substrate of the embodiment of FIG. 5A for cutting.
Figure 5B:
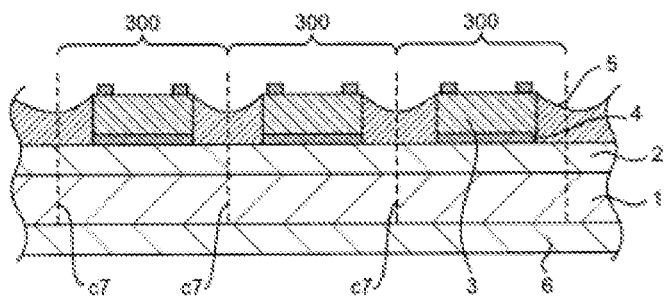
Figure 6A:
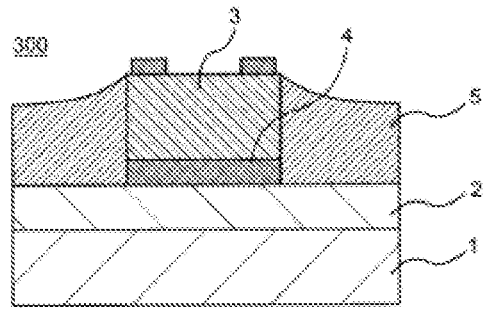
FIGS. 6A through 6C are cross sectional views illustrating a modification of the light emitting device according to the first embodiment, FIG. 6A showing an embodiment in which the resin does not fill the entire space between light emitting elements, FIG. 6B showing an embodiment in which a thickness of the resin decreased linearly with increasing distance from a light emitting element, and FIG. 6C showing an embodiment in which a thickness of the resin increases with increasing distance from a light emitting element.
Figure 6B:
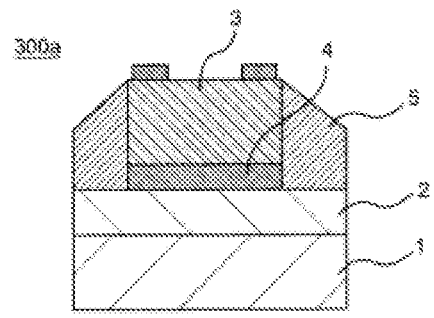

In the previous embodiments, the resin 5 is embedded such that its upper face corresponds to the plane containing the electrode formed faces 3c, but it is only an example of preferred embodiments, and the present invention is not limited thereto. The amount of resin to be embedded may be reduced so that the surface of the embedded resin is bowed inward at the center part of the resin 5 embedded in the space between the light emitting device 3. FIG. 5A shows a state after a reduced amount of resin 5 is embedded, and FIG. 5B shows a state in the cutting. FIG. 6A shows a cut light emitting device 300. Like this, it is not required that the resin 5 fills up the entire space between the light emitting elements 3, but only required that the side faces of the light emitting elements 3 are covered with the resin 5. That is, it is only required that the resin 5 is provided at least at the periphery of each light emitting element 3. In other word, the upper face of the cured resin 5 may be either parallel or tilted to the plane containing the electrode formed faces 3c of the light emitting element 3. As used herein, the term "tilted" means that the thickness (in the direction perpendicular to the electrode formed face) of the resin 5 decreases with the increasing distance from the light emitting element 3. As illustrated in FIG. 6B, the term also includes that the thickness (in the direction perpendicular to the electrode formed face) decreases linearly with the increasing distance from the light emitting element 3. If the thickness of the resin on the side faces of the light emitting element 3 (the thickness in the direction perpendicular to the side faces) is small, the thickness (in the direction perpendicular to the electrode formed face) decreases linearly with the increasing distance from the light emitting element 3 as illustrated in FIG. 6B.

Figure 6C:
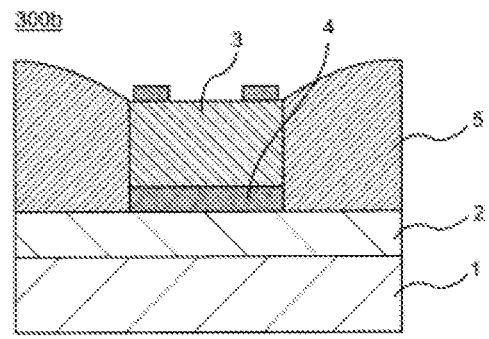

Further, in the present embodiment, if the device is connected by wire-bonding or the like for example, the thickness (in the direction perpendicular to the electrode formed face) increases with the increasing distance from the light emitting element 3 as illustrated in FIG. 6C.

EXAMPLES

Example 1

Example 1 will be described below. In Example 1, a light emitting device 100 is prepared by the manufacturing method of the first embodiment.

FIG. 1A to 1E is a cross-sectional view illustrating a workflow of a manufacturing method according to Example 1. FIG. 3 is a cross-sectional view illustrating configuration of a nitride semiconductor light emitting element that is used in the light emitting device according to Example 1. FIG. 4 is a plan view of the nitride semiconductor light emitting element of FIG. 3.

The light emitting device 100 of Example 1 has a 1.5 mm square shape in a plan view, and includes a light emitting element 3, a translucent substrate 1, a phosphor layer 2, an adhesive 4 and a resin 5.

In the light emitting device 100, the translucent substrate 1 is made of a 200 μm-thick glass, and the phosphor layer 2 contains a YAG phosphor and has a thickness of 50 μm, which is provided on the translucent substrate 1. The translucent substrate 1 is provided with anti-reflection films (not shown) both between the phosphor layer 2 and the translucent substrate 1 and on the other surface of the translucent substrate 1 from the phosphor layer 2. On the upper face of the phosphor 2, the light emitting element 3 having a 1.4 mm square shape in a plan view, which is described below, is bonded by the adhesive 4 of silicone resin. The side faces of the light emitting element 3, the surface (exposed face) of the adhesive 4 and the upper face of the phosphor layer 2 are covered with the resin 5 that is made of silicone resin and contains $TiO_2$ as a light reflective material. The resin 5 is provided such that it does not cover the electrode formed face of the light emitting element 3, and the upper face thereof is tilted such that the thickness decreases with the increasing distance from the light emitting element 3 as illustrated in FIG. 5. Each side face of the light emitting device 100 is flat, i.e. side faces of the translucent substrate 1, phosphor layer 2 and resin 5 are flush with each other.

The light emitting element 3 will be described.

The light emitting element 3 includes a sapphire substrate 11 having a textured surface and a semiconductor layer formed thereon. On the sapphire substrate 11, a buffer layer is formed. Then, an n-type nitride semiconductor layer 12 is laminated, which will be connected to a negative electrode 14. On the n-type nitride semiconductor layer 12, a light emitting layer 10 having a multi quantum well structure is formed. On the light emitting layer 10, a p-type nitride semiconductor layer 13 is laminated, which will be connected to a positive electrode 19. In this way, the semiconductor layer is obtained.

In the center part of the semiconductor layer, the p-type nitride semiconductor layer 13, the light emitting layer 10 and the n-type nitride semiconductor 12 are partially removed in a circular shape to form a surface 18 and a opening 31 where the n-type nitride semiconductor layer 12 is exposed. On the surface 18 and the upper face of the p-type nitride semiconductor layer 13, ITO/Rh/Au/Rh/Ti are laminated in this order to provide the negative electrode 14 and positive electrode 19 respectively. The positive electrode 19 is formed in a broad area on the p-type nitride semiconductor layer 13 except for the vicinity of the opening 31 and the periphery.

Next, by laminating an Al alloy/Ti/Pt/Au/Ni in this order, a p-terminal lead electrode 16 is formed in an approximately rectangular shape between the opening 31 and one of the side edges on the positive electrode 19. The lead electrode 16 is an electrode for mounting the light emitting device 100 or 200 on a mounting board.

As an insulation film 17a, a DBR film composed of three pairs of $SiO_2/Nb_2O_5$ laminated together is formed covering the side faces of the positive electrode 19, p-type nitride semiconductor layer 13 and n-type nitride semiconductor layer 12 except for a part of the upper face of the above-mentioned negative electrode 14 and a part of the upper face of the p-terminal lead electrode 16. The insulation film 17a is processed to have an opening 32 inside the opening 31 in a concentric manner, and an opening 33 on the p-terminal lead electrode 16.

In the present example, the insulation film 17a is formed covering a part of the p-terminal lead electrode 16, but the p-terminal lead electrode 16 may be provided on the insulation film 17a instead.

On the negative electrode 14 formed on the surface 18, an Al alloy/Ti/Pt/Au/Ni is laminated in this order in the same manner as the p-terminal lead electrode 16 to extend the negative electrode 14. The positive electrode 19 is substantially covered with the negative electrode 14 sandwiching the insulation film 17a.

Furthermore, the electrodes and semiconductor layer are covered with an insulation film 17b of $SiO_2$, leaving an opening 35 corresponding to the opening 33 on the lead electrode 16, and an opening 34 on the negative electrode 14 opposite to the opening 35.

This is the configuration of the light emitting device 100 having a 1.5 mm square shape in a plan view.

The light emitting device 100 of Example 1 is manufactured by the following method.

(Manufacture of Light Emitting Element 3)

First, the sapphire substrate 11 having a textured surface is placed in an MOCVD apparatus, and a GaN layer of undoped nitride semiconductor (not shown in the figures) is formed on the textured surface of the sapphire substrate 11 as a buffer layer. Next, a Si-doped n-type GaN layer is laminated as an n-type contact layer, and a GaN layer of undoped nitride semiconductor is further laminated thereon. Thus, the n-type nitride semiconductor layer 12 is formed. On the n-type nitride semiconductor layer 12, a set of a GaN barrier layer and an InGaN well layer are laminated for nine times, and a GaN barrier layer is further laminated at the end. Thus, a multiple quantum well structure is formed as the light emitting layer 10. On the light emitting layer 10, an Mg-doped AlGaN p-type clad layer and an Mg-doped GaN p-type contact layer is sequentially laminated as the p-type nitride semiconductor layer 13. Through these steps, a wafer with semiconductor layers is obtained.

The p-type nitride semiconductor layer 13, the light emitting layer 10 and the n-type nitride semiconductor layer 12 are partially removed by etching to form the surface 18 where the n-type nitride semiconductor layer 12 is exposed. On the surface 18 and the upper face of the p-type nitride semiconductor layer 13, ITO/Rh/Au/Rh/Ti are laminated in this order by sputtering. Thus, the negative electrode 14 and the positive electrode 19 are formed.

As the insulation film 17a, a DBR film composed of triply-laminated pairs of $SiO_2/Nb_2O_5$ is formed covering the upper and side faces of the positive electrode 19, p-type nitride semiconductor layer 13 and n-type nitride semiconductor layer 12, except for a part of the upper face of the above-mentioned negative electrode 14 formed on the surface 18, and also except for the area where the p-terminal lead electrode 16 will be connected to the positive electrode 19.

The p-terminal lead electrode 16 is formed in electrical connection with the positive electrode 19. Further, the negative electrode 14 is extended to overlap with the positive electrode 19 sandwiching the insulation film 17a, in which the extended part is electrically connected to the negative electrode 14 on the surface 18.

As the insulation film 17b, $SiO_2$ is formed by sputtering on the surfaces of the n-type nitride semiconductor layer 12, light emitting layer 10, p-type nitride semiconductor layer 13, positive electrode 19 and negative electrode 14, i.e. covering the entire wafer, except for a part of the upper face of the p-terminal lead electrode 16 and a part of the upper face of the negative electrode 14 extending over the positive electrode 19.

The wafer obtained by the above method is cut and divided into individual devices at predetermined positions by dicing, breaking or the like. In this way, the blue light emitting elements 3 having a 1.4 mm square shape are manufactured. To prepare for manufacturing the light emitting devices 100 described below, the manufactured light emitting elements 3 are sorted and classified into groups having similar emission wavelength ranges or similar emission properties.

(Manufacture of Light Emitting Device 100)

Next, a translucent substrate 1 of 200 μm thick glass having anti-reflection layers on both sides is prepared. On the anti-reflection film on the upper side of the translucent substrate 1, a 50 μm thick phosphor layer 2 containing a YAG phosphor is formed. Onto the phosphor layer 2, the light emitting elements 3, which were classified according to the emitting properties, are bonded with the adhesive 4 of silicone resin such that the sapphire substrate 11 faces the phosphor layer 2. The light emitting elements 3 are arranged in a grid at approximately 100 μm intervals. The resin 5 of $TiO_2$-containing silicone resin is applied to cover the side faces of the arranged light emitting elements 3, and is then heated at 150° C. for 2 hours to be cured. Subsequently, a sheet 6 is pasted on the back face of the translucent substrate 1, i.e. the other side of the translucent substrate 1 from the phosphor layer 2, and the substrate 1 are cut and divided by dicing in the direction from the light emitting elements 3 to the translucent substrate 1 along the midways between adjacent light emitting elements 3. In this way, the light emitting devices 100 having a 1.5 mm square shape are manufactured.

In the present example, the negative electrode 14 of the light emitting element 3 is three-dimensionally extended over the positive electrode 19 to increase the electrode area, which imparts good heat dissipation characteristics to the device. Furthermore, since the light emitting elements 3 are screened to have similar emission properties and the phosphor layer 2 has a uniform thickness, the obtained light emitting devices 100 have improved unevenness in color.

The semiconductor light emitting device of the present embodiment can be used for light sources of lightings, various indicators, automobiles, displays, liquid crystal backlights, sensors and traffic signals, and the like.

What is claimed is:

1. A light emitting device comprising:
   a light emitting element that comprises
      (a) a first semiconductor layer on a substrate and a second semiconductor layer on the first semiconductor layer, wherein a first electrode and a second electrode are respectively provided on same sides of the first semiconductor layer and the second semiconductor layer, the first electrode being surrounded by the second semiconductor layer; and
      (b) a metal film extending from the first electrode over the second semiconductor layer so as to be insulated by an insulation film;
   a phosphor layer covering the substrate of the light emitting element; and
   a resin layer covering side faces of the light emitting element.

2. The light emitting device according to claim 1 further comprising:
   a translucent substrate facing the substrate of the light emitting element across the phosphor layer; and
   an anti-reflection film both or either between the phosphor layer and the translucent substrate and/or on the other face of the translucent substrate from the phosphor layer.

3. A light emitting device comprising:
   a light emitting element that comprises
      (a) a first semiconductor layer on a substrate and a second semiconductor layer on the first semiconductor layer, wherein a first electrode and a second electrode are respectively provided on same sides of the first semiconductor layer and the second semiconductor layer; and
      (b) a metal film extending from the first electrode over the second semiconductor layer so as to be insulated by an insulation film;
   a phosphor-containing substrate covering the substrate of the light emitting element; and
   a resin layer covering side faces of the light emitting element.

4. The light emitting device according to claim 3, wherein the first electrode is surrounded by the second semiconductor layer.

5. The light emitting device according to claim 3, wherein the resin layer contains phosphor particles.

6. The light emitting device according to claim 3, wherein the resin layer contains a light reflective material.

* * * * *